United States Patent [19]

Kim et al.

[11] Patent Number: 5,003,357
[45] Date of Patent: Mar. 26, 1991

[54] SEMICONDUCTOR LIGHT EMITTING DEVICE

[75] Inventors: Bun-Joong Kim, Seoul; Jun-Young Kim, Suwon, both of Rep. of Korea

[73] Assignee: Samsung Semiconductor and Telecommunications Co., Gumi, Rep. of Korea

[21] Appl. No.: 465,525

[22] Filed: Jan. 17, 1990

Related U.S. Application Data

[63] Continuation of Ser. No. 192,773, May 11, 1988, abandoned.

[30] Foreign Application Priority Data

May 30, 1987 [KR] Rep. of Korea .................. 87-5493

[51] Int. Cl.$^5$ .................. H01L 33/00; H01L 29/72; H01L 29/06
[52] U.S. Cl. .................. 357/17; 357/35; 357/47; 357/49; 357/52; 357/55; 357/56
[58] Field of Search .................. 357/55, 17, 35, 47, 357/49, 52, 56

[56] References Cited

U.S. PATENT DOCUMENTS

| | | |
|---|---|---|
| 3,883,772 | 5/1975 | Wako et al. ........................ 357/17 |
| 4,013,915 | 3/1977 | Dufft ................................. 357/17 |
| 4,310,362 | 11/1982 | Roche ............................... 437/190 |
| 4,486,945 | 12/1984 | Aigoo ............................... 357/72 |
| 4,691,214 | 9/1987 | Hayakawa et al. ............... 357/17 |

FOREIGN PATENT DOCUMENTS

| | | |
|---|---|---|
| 3404875 | 8/1985 | Fed. Rep. of Germany . |
| 59-108382 | 6/1984 | Japan .......................... 357/17 |
| 60-74487 | 4/1985 | Japan .......................... 357/17 |
| 60-137076 | 7/1985 | Japan .......................... 357/17 |
| 62-23163 | 1/1987 | Japan .......................... 357/17 |

OTHER PUBLICATIONS

Shah, "High-Efficiency Electroluminescent Diodes"; IBM Technical Disclosure Bulletin.

Primary Examiner—Andrew J. James
Assistant Examiner—Ngan Van Ngo
Attorney, Agent, or Firm—Cushman, Darby & Cushman

[57] ABSTRACT

This invention is related to a semiconductor light emitting device integrated with a Si-heat sink which contains not only a beam deflector but also the driving integrated circuits. A semiconductor light emitting device comprising a Si-substrate 2, V-groove 3 etched into substrate 2 and a beam deflector 9 on the wall of V-groove 3 wherein the transistor 22 for the driving and control on said Si-substrate is integrated so that light emitting device 1 and said integrated circuit are integrally mounted. The advantage of this invention is that the integration of the driving transistor with the light emitting device in the same package head reduces the packaging and bonding problems. Obtained is a compact optical system which easily radiates the heat dissipated by devices. This is in contrast to conventional light emitting devices which use the Si-substrate only as a mount and beam deflector.

2 Claims, 2 Drawing Sheets

SEMICONDUCTOR LIGHT EMITTING DEVICE

This is a continuation of application Ser. No. 07/192,773, filed May 11, 1988, which was abandoned upon the filing hereof.

BACKGROUND OF THE INVENTION

The invention relates to semiconductor light emitting devices containing a beam deflector, and more particularly to a semiconductor light emitting device integrated with a Si-heat sink which contains not only a beam deflector but also driving integrated circuits.

Nowadays, surface light emitting devices are studied by various research groups and they usually use a beam deflector to change the propagation direction of light. Conventionally, for making of such a beam deflector, mount head fabrication by micro-machining, molding of polymer and V-groove etching of the substrate whose etching characteristic is anisotropic, are usually employed.

Referring to FIG. 1 which shown a conventional light emitting device, the light emitting device 1 is mounted on the silicon substrate into which the V-groove etching 3 has occurred, and a gold wire 5 is bonded on its electrode 4.

FIG. 2 shows one embodiment of FIG. 1 where the light emitting device 1 is composed of p-type 6 and n-type 7 layers, which form a pn junction. The doping type of the Si-substrate 2 is the same as that of the lower layer 7 of the light emitting device 1. After anisotropic etching of the Si-substrate 2 to form for making of V-groove 3, metal-layers for ohmic contact such as gold are deposited on both sides of the Si-substrate. After alloying the ohmic contacts with the Si-substrate, the light emitting device 1 is bonded on the V-groove 3 of Si-substrate 2 with tin solder gold paste or the other soldering materials. The lower layer 7 of the light emitting device 1 can transmit current through ohmic contact 8, Si-substrate 2 and the opposite electrode 10. The upper layer 6 can be connected electrically by electrode 4 and gold wire 5. The light output from the light emitting device 1 is reflected upward by beam deflector 9.

In the conventional method, however, the Si-substrate is only used for the beam deflector and heat sink, and not used for the driving circuit or for a signal processing circuit.

Therefore, it is a principal object of this invention to provide a light emitting device integrated with a Si-heat mount which contains not only a beam deflector but also the driving integrated circuits.

DETAILED DESCRIPTION OF A SPECIFIC EMBODIMENT

Referring to the figures, an embodiment of the invention will be explained in detail.

Figure 3:
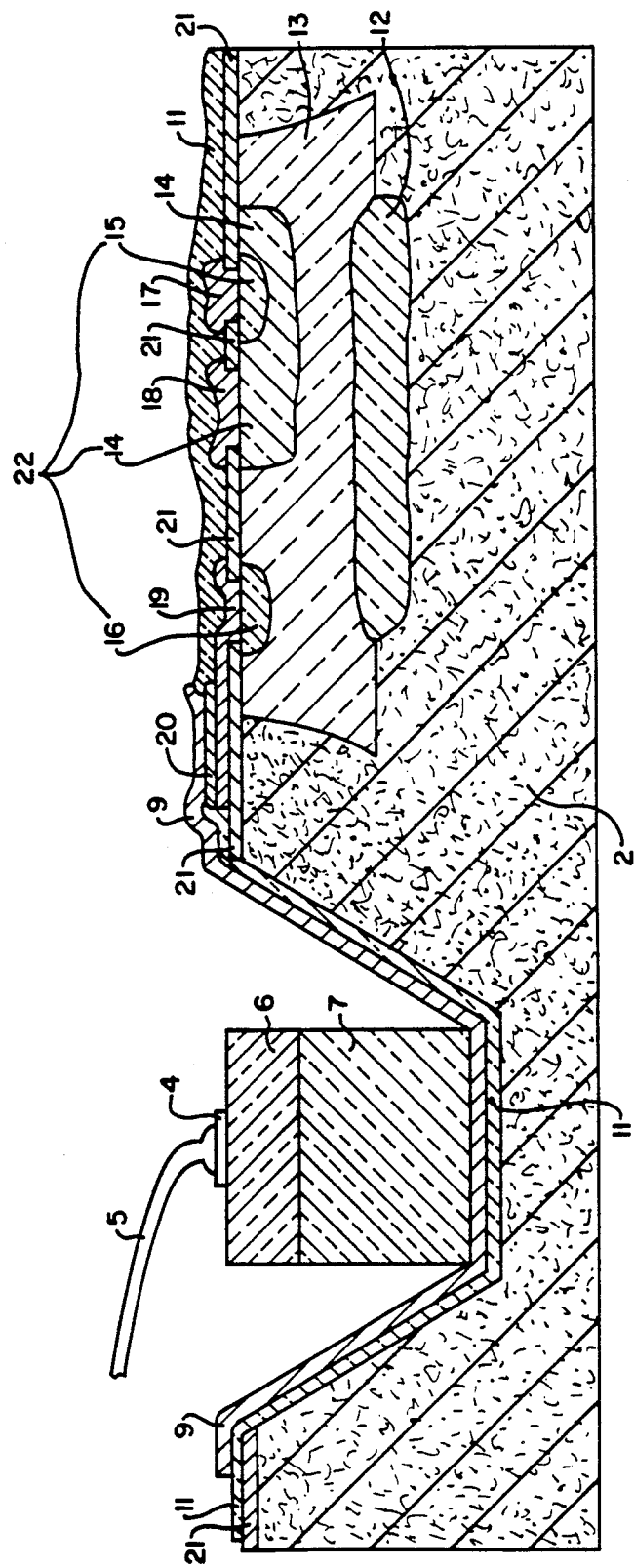
FIG. 3 is a cross-sectional view of the semiconductor light emitting device of this invention.

As shown in FIG. 3, a npn transistor 22 is fabricated on a p-type silicon substrate 2 in a conventional way. When the Si-substrate 2 has a <100> surface plane, the V-groove can be etched through the patterned $SiO_2$ mask 21 in KOH solution at 80° C. or by alternative methods. For the pattern aligned to <$\overline{1}10$> or <110> direction, the angle of etched V-groove is about 54° with respect to the substrate plane.

Next the contact openings of the integrated circuit, in this case for transistor 22, can be formed. After the formation of the base, emitter and collector electrodes 17, 18, 19 of transistor 22, another intermetallic layer 20 is deposited to prevent the metallic layer 9 from reaction with the electrode metals. Metallic layer 9 is deposited and patterned by conventional photolithography processes for the interconnection of the light emitting device and the transistor. Then the light emitting device 1 is mounted on the bottom side of the groove of the silicon substrate 2 using Sn solder, Ag paste or some other electrically conductive materials.

Figure 1:
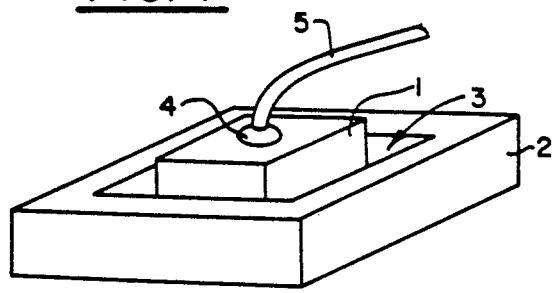
FIG. 1 is a perspective view of the conventional semiconductor light emitting device containing a beam deflector.
Figure 2:
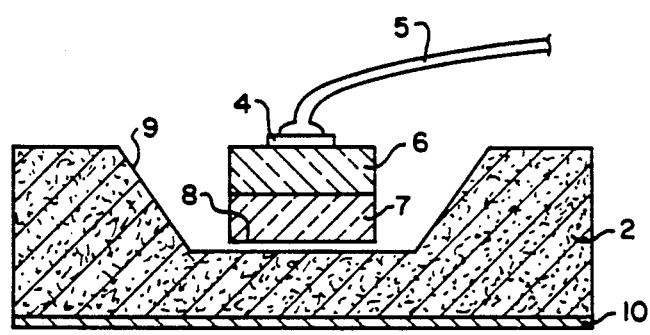
FIG. 2 is a cross-sectional view of a conventional semiconductor light emitting device containing the beam deflector.
Figure 4:
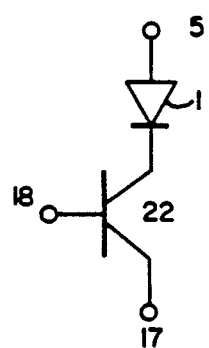
FIG. 4 is the equivalent circuit according to an embodiment of this invention.

The intermetallic layer is Pt or Ti when said electrode metal and said metal layer 9 are gold and aluminum, respectively. The npn transistor 22 and light emitting device 1 are isolated electrically by passivation layer 11 and the electrode 19 of collector 16 is connected to the lower layer 7 of light emitting device 1 Via the metal layer 9 and intermetallic layer 20. The equivalent circuit for this is structure shown in FIG. 4. Not only said npn transistor 22 but also resistors, capacitors, pnp transistors, FET, diodes and the driving integrated corcuits for the light emitting device can be deposited or formed on the silicon substrate.

Also, since the light emitting device is isolated by passivation layer 11, not only the silicon substrate but also, only semiconductor substrate of III–V family or II–VI family composition can be used as an auxiliary substrate/submount by anisotropic etching. Further, the silicon substrate can be used for heat sink as a light emitting device of GaAs or InP, and even array-type surface emitting light emitting devices integrated with driving integrated circuits such as transistors can be obtained when the V-grooves are etched in an array.

Therefore, in this invention, contrary to the conventional light emitting devices which use the Si-substrate only as a mount and beam deflector, the integration of driving transistors with light emitting device in the same package head can also be obtained to reduce the packaging and bonding problems and to attain a compact optical system, and make it easy to radiate the heat dissipated by such devices.

The invention is in no way limited to the example described hereinabove. Various modifications of the disclosed embodiment; as well as other embodiments of the invention, will become apparent to persons skilled in the art upon reference to the description of the invention. It is therefore contemplated that the appended claims will cover any such modifications or embodiments as fall within the true scope of the invention.

What is claimed is:

1. An integrated semiconductor light emitting device comprising:

a silicon substrate having a major surface;

an integrated circuit comprising at least one transistor formed in said major surface of the silicon substrate;

a V-shaped groove etched in the major surface of the silicon substrate adjacent to said integrated circuit;

a passivation layer formed simultaneously in said V-shaped groove and over said transistor;

a reflective metallic layer formed above said passivation layer in said V-shaped groove;

a semiconductor light emitting means mounted in said V-shaped groove, said V-shaped groove reflecting light emanating from said light emitting means; and an electrical interconnection between said semiconductor light emitting means and said integrated circuit connecting said circuit and light emitting means together, whereby said integrated circuit drives and controls said light emitting means.

2. The integrated semiconductor light emitting device of claim 1 wherein said electrical interconnection includes an intermetallic diffusion layer between said reflective metallic layer and said integrated circuit, said intermetallic diffusion layer formed before forming said reflective metallic layer.

* * * * *